(12) United States Patent
Ochi et al.

(10) Patent No.: US 7,149,091 B2
(45) Date of Patent: Dec. 12, 2006

(54) ELECTRONIC CIRCUIT DEVICE

(75) Inventors: Takao Ochi, Shiga-gun (JP); Junichi Shinyashiki, Sakai (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 122 days.

(21) Appl. No.: 10/829,580

(22) Filed: Apr. 22, 2004

(65) Prior Publication Data

US 2004/0212061 A1    Oct. 28, 2004

(30) Foreign Application Priority Data

Apr. 25, 2003    (JP) .............................. 2003-122575

(51) Int. Cl.
*H05K 1/16*    (2006.01)
(52) U.S. Cl. ...................... 361/765; 361/736; 361/737; 361/760; 174/52.2; 235/492
(58) Field of Classification Search ........ 361/736–737, 361/760–764; 257/691–692, 784–790; 174/52.1–52.2; 235/492–494
See application file for complete search history.

(56) References Cited

U.S. PATENT DOCUMENTS 5,420,757 A * 5/1995 Eberhardt et al. .......... 361/813
5,834,755 A * 11/1998 Haghiri-Tehrani et al. .. 235/492
6,607,135 B1 * 8/2003 Hirai et al. ................. 235/487

FOREIGN PATENT DOCUMENTS

| JP | 7-321438 | 12/1995 |
| JP | 9-162208 | 6/1997 |
| JP | 10-92968 | 4/1998 |

* cited by examiner

*Primary Examiner*—Tuan Dinh
(74) *Attorney, Agent, or Firm*—Hamre, Schumann, Mueller & Larson, P.C.

(57) ABSTRACT

An electronic circuit device, includes: internal terminals; a board on which wirings to the internal terminals are formed; an electronic component that is mounted on the board and is connected with the internal terminals; and an encapsulation resin with which the electronic component and the internal terminals are encapsulated. A part of the wiring forms a ring-shaped portion, and the ring-shaped portion has a plurality of gaps by which the ring-shaped portion is divided into a plurality of discontinuous ring-constituting sections. The plurality of ring-constituting sections are connected to the respective internal terminals, and a coating region of the encapsulation resin is surrounded with the ring-shaped portion. The applied area of the encapsulation resin can be controlled to be constant without using a special element for controlling the flow of the encapsulation resin.

16 Claims, 8 Drawing Sheets

ELECTRONIC CIRCUIT DEVICE

BACKGROUND OF THE INVENTION

1. Field of the Invention

The present invention relates to an electronic circuit device in which electronic components such as semiconductor memory are bare-chip mounted, and, for example, relates to a COB (chip on board) type electronic circuit device.

2. Related Background Art

In accordance with the trend toward compact, lightweight, and portable electronic equipment, there is an increased demand for a compact and lightweight electronic circuit device in which electronic components such as semiconductor components are mounted on a board. As the electronic circuit device for a compact configuration, a COB type semiconductor device is known, for example, in which a semiconductor element is bare-chip mounted on a board.

In the COB type semiconductor device, a semiconductor chip is mounted on the board via a die bonding material. A conductive wiring is provided on the board, and an internal terminal at one end of the conductive wiring and an electrode provided on the semiconductor chip are connected via a metal wire. The semiconductor chip and the internal terminal are encapsulated with resin.

In a manufacturing process for a conventional COB type electronic circuit device, an encapsulation resin for encapsulating the semiconductor chip, etc., is applied by potting. Therefore, since there is no means for controlling the spreading of the resin, the wettability and the spreadability of the resin vary greatly depending on the viscosity, the applied amount and the temperature of the resin, the condition of the board and the like. As a result, it is difficult to control an applied area of the resin to be constant, so that there is a limitation on the miniaturization of the products and a cost is high.

In order to solve this problem, JP H09(1997)-162208 A and JP H10(1998)-92968 A show a method for blocking a flow of an encapsulation resin by forming a printed bank on the periphery of a region for packaging a semiconductor chip, the bank protruding from a surface of a board.

However, since in the above conventional example, a new element is used for forming the bank to control the flow of the encapsulation resin in addition to ordinary constituting elements, the manufacturing cost will be increased. Also, by adding the extra element in addition to the original constituting elements, there is a risk of a decrease in reliability. For instance, in the case where the bank for controlling the flow of the encapsulation resin is formed with a resist coat, and if there is a portion of the resin bank overlapping a Cu wiring, it becomes difficult to cover the Cu wiring with Ni/Au plating at an edge of the coat. Therefore, there may be a deterioration in the anticorrosion capabilities of the wiring.

SUMMARY OF THE INVENTION

Therefore, with the foregoing in mind, it is an object of the present invention to provide a compact and high-reliability COB type electronic circuit device at a low cost, by which an applied area of an encapsulation resin can be controlled to be constant without adding a special element for controlling a flow of an encapsulation resin to elements required originally.

The electronic circuit device of the present invention includes: internal terminals; a board on which wirings to the internal terminals are formed; an electronic component that is mounted on the board and is connected with the internal terminals; and an encapsulation resin with which the electronic component and the internal terminals are encapsulated. A part of the wiring forms a ring-shaped portion, the ring-shaped portion having a plurality of gaps by which the ring-shaped portion is divided into a plurality of discontinuous ring-constituting sections. The plurality of ring-constituting sections are connected to the respective internal terminals, and a coating region by the encapsulation resin is surrounded with the ring-shaped portion.

DETAILED DESCRIPTION OF THE INVENTION

In the electronic circuit device of the present invention, the ring-shaped portion that is formed at a part of the wiring surrounds the coating region of the encapsulation resin. Therefore, when filling with the encapsulation resin, a bank with a thickness of the ring-shaped portion suppresses the flow of the encapsulation resin, thereby facilitating the adjustment of an applied area of the encapsulation rein. This bank is formed using the wiring without adding any special elements to the elements required originally, so that a compact and high-reliability electronic circuit device can be realized at a low cost.

Herein, the "ring-shaped" in the present invention may be defined as a strip-shaped configuration that surrounds a certain region, and is not limited to a circular form. For instance, it includes an oval, an ellipse or a polygonal surrounding configuration as well. Furthermore, it does not refer to a completely continuous configuration, but as long as the surrounding configuration can be formed as a whole, the configuration including a plurality of discontinuous portions also corresponds to the "ring-shape" referred to by the present invention.

The ring-shaped portions of the wirings may be formed as a multi-ring, i.e., in a concentric manner, whereby the effect of controlling the flow of the encapsulation resin can be enhanced. In such a case, preferably, the internal terminals are disposed within the ring-shaped portion, the wirings extend from an outside of the ring-shaped portion to the respective internal terminals so as to be connected thereto via the ring-shaped portion, and a connecting point of the wiring extending from the internal terminal with the ring-shaped portion and a connecting point of the wiring extending from the outside with the ring-shaped portion are disposed at positions different from each other.

Preferably, an intersecting portion of the ring-shaped portion and another portion of the wiring is shaped like a letter T. That is, portions of the ring-shaped extend on both sides of the other wiring portion at the intersection. In addition, preferably, the gaps provided in the respective wirings of the multi-ring as the ring-shaped portion are disposed so as not to be on the same normal line (the radius in the case of a circular ring-shaped portion) with respect to the ring-shaped portion. The wiring may be connected with a wiring on a rear face of the board via a through hole formed in the board, the through hole being disposed adjacent to an outer edge of the ring-shaped portion. This through hole may be disposed within the ring-shaped portion. Preferably, a part of the wiring is formed so as to divide an inner region the ring-shaped portion into a region including the internal terminals and a region not including the internal terminals.

When three or more wirings are formed, preferably, at an intersecting portion of the wirings and the ring-shaped portion, two or less line segments are disposed linearly and in parallel from an outside to an inside of the ring-shaped portion.

It is preferable that the wiring extending on the outside of the ring-shaped portion and the ring-shaped portion of the wiring intersect each other at angles of 60° or more.

The following describes electronic circuit devices as embodiments of the present invention, with reference to the drawings. In the following descriptions of the embodiments, a semiconductor device in which a semiconductor chip is packaged on a board is described as one example. However, technical ideas of the following respective embodiments can be applied similarly to the cases of electronic circuit devices in which other electronic components are packaged on a board.

Figure 1A:
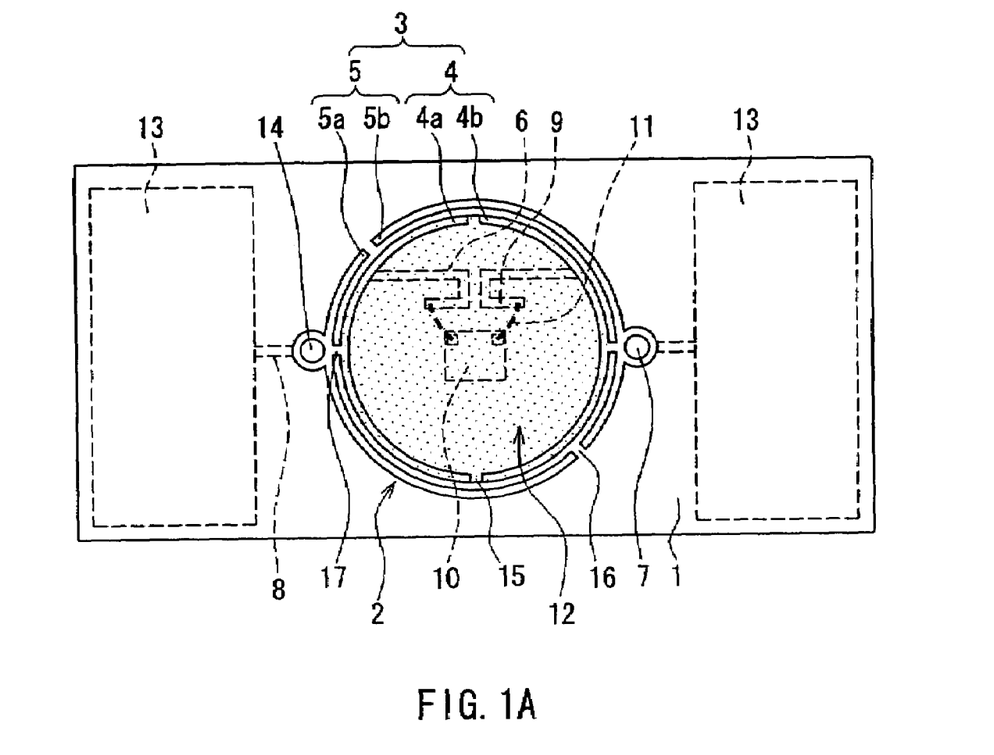
FIG. 1A is a plan view showing a basic configuration of a semiconductor device as one embodiment of the present invention.
Figure 1B:
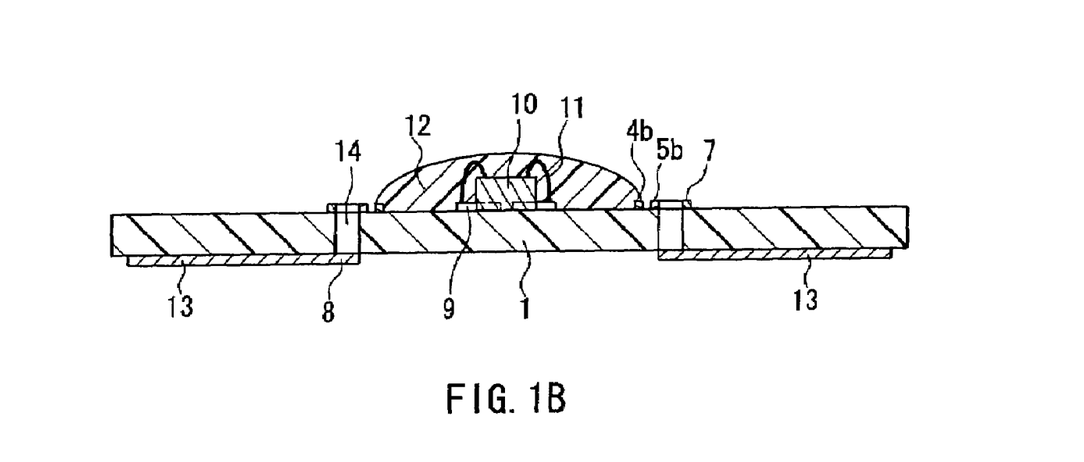
FIG. 1B is a cross-sectional view of the same.

Firstly, referring to FIG. 1A and FIG. 1B, a basic configuration of the semiconductor device as one embodiment of the present invention will be described below. FIG. 1A is a plan view showing a configuration of a card-type semiconductor device, and FIG. 1B is a cross-sectional view of the same. On a top surface of a board 1 that is made of a base material used for printed boards, a wiring 2 is formed. The wiring 2 includes a ring-shaped portion 3, an internal wiring 6 that is disposed within the ring-shaped portion 3, a small ring portion 7 that is disposed on the outside of the ring-shaped portion 3 and an external wiring 8. The ring-shaped portion 3 is made up of an inner ring portion 4 and an outer ring portion 5, and the internal wiring 6 is connected with the inner ring portion 4. A tip end portion of the internal wiring 6 forms an internal terminal 9. In the proximity of the internal terminal 9, the semiconductor chip 10 is bonded, and an electrode of the semiconductor chip 10 is connected with the internal terminal 9 via a wire 11. An inner portion of the inner ring portion 4 is filled with an encapsulation resin so as to encapsulate the semiconductor chip 10, the wire 11, the internal terminal 9 and the internal wiring 6. The external wiring 8 is formed on a rear face of the board 1 and is connected with an external electrode 13. The small ring portion 7 is formed at a position corresponding to a through hole 14 that is provided in the board 1. The small ring portion 7 and the external wiring 8 are connected electrically via an electrode provided on the through hole 14.

Figure 2A:
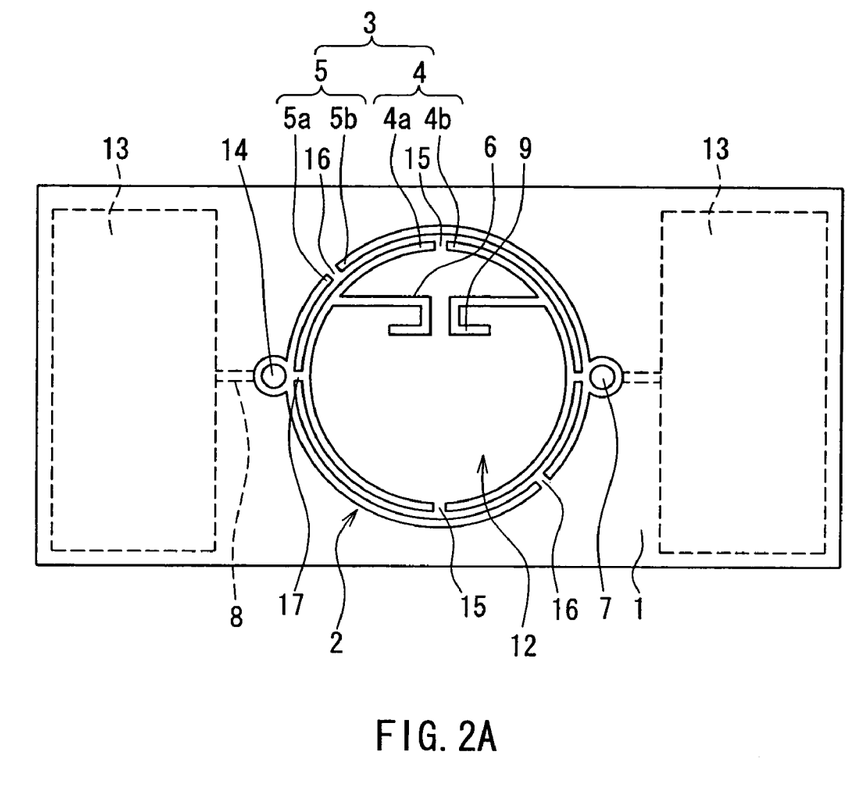
FIG. 2A is a plan view showing a configuration of a main portion constituting the semiconductor device of FIG. 1.
Figure 2B:
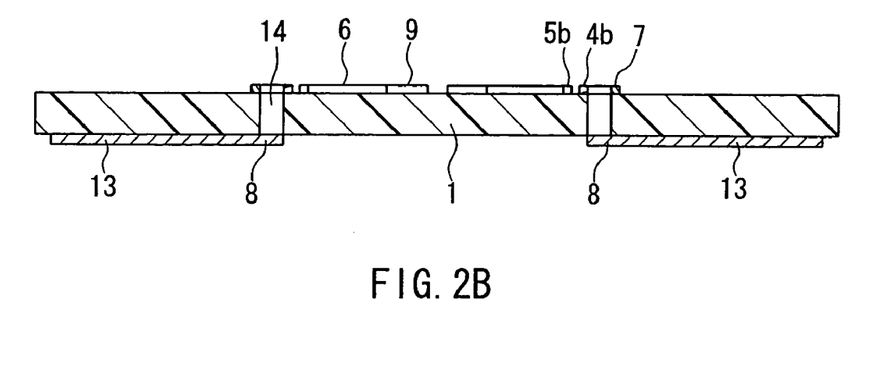
FIG. 2B is a cross-sectional view of the same.

FIG. 2A and FIG. 2B show a state where the wiring 2 is formed on the board 1, but the semiconductor chip 10, the wire 11 and the encapsulation resin 12 are not provided. Now referring to these drawings, the configuration of the ring-shaped portion 3 will be described below. The inner ring portion 4 and the outer ring portion 5, which are disposed doubly, have two gaps 15 and 16, respectively, so as to be divided into a pair of ring-constituting sections 4a and 4b and a pair of ring-constituting sections 5a and 5b, respectively. The ring-constituting sections 4a and 4b of the inner ring portion 4 and the ring-constituting sections 5a and 5b of the outer ring portion 5 correspond, respectively, and are connected via connecting portions 17. In addition, the ring-constituting sections 4a and 4b of the inner ring portion 4 are connected with the pair of the internal wirings 6, respectively. The small ring portions 7 are formed adjacent to the respective ring-constituting sections 5a and 5b of the outer ring portion 5. Thereby, two wirings are formed so as to establish a connection from the internal terminal 9 to the external electrode 13 via the internal wiring 6, the ring-constituting section 4a, the connecting portion 17, the ring-constituting section 5a, the small ring portion 7, the through hole 14 and the external wiring 8. This configuration of the wirings, although the ring-shaped portion 3 intervenes therein, is similar to the ordinary wiring basically.

According to the configuration of the above-stated semiconductor device, the covering region of the encapsulation resin 12 is surrounded with the ring-shaped portion 3 that is formed as a part of the wiring 2. Therefore, when filling with the encapsulation resin 12, the bank with a thickness of the ring-shaped portion 3 suppresses the flow of the encapsulation resin 12, thus facilitating the control of the applied area of the encapsulation resin 12. Also, since no special elements are required for controlling the flow in addition to the elements required originally, a compact and high-reliability COB type electronic circuit device can be realized at a low cost.

An interval of the gaps 15 and 16 preferably is set at less than 0.2 mm. When the space is larger than that, the encapsulation resin becomes likely to overflow. In view of the surface tension of the encapsulation resin, the ring-shaped portion 3 preferably is circular because this shape prevents the encapsulation resin from overflowing most effectively. However, the practical effects can be obtained sufficiently from an oval, an ellipse and polygons such as a quadrangle and a triangle as well. As the board 1, a base material made of glass epoxy, for example, can be used. The wiring 2 may be a pattern made of copper foil with Ni and Au plated. A thickness of the wiring 2 normally may be set in a range of about 20 to 80 μm, and a width of the same may be set in a range of about 0.1 to 0.3 mm. As the angle of the sidewall of the wiring 2 relative to the board 1 becomes closer to 90°, a larger effect for stopping the flow of the resin can be obtained because of the surface tension. As the encapsulation resin 12, an epoxy resin, an acrylic resin and the like can be used.

In order to secure a function as the wiring and to control the flow of the encapsulation resin 12 effectively, it is necessary to set the planar shape of the ring-shaped portion 3 appropriately. Then, the following descriptions on the embodiments are dedicated for explaining the planar shapes of the ring-shaped portion 3 more specifically. The remaining configurations are the same as those of the above-described semiconductor device.

EMBODIMENT 1

Figure 3:
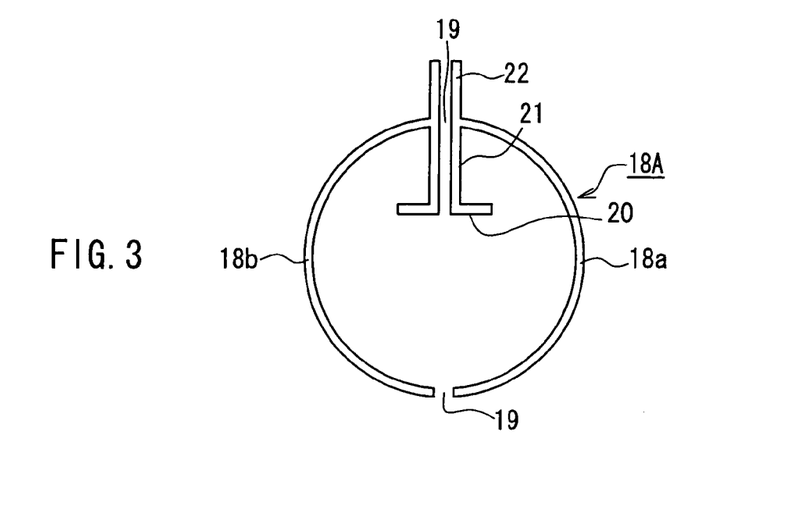
FIG. 3 is a plan view showing a shape of a main portion of a wiring of Embodiment 1.

FIG. 3 is a plan view showing a shape of a main portion of a wiring constituting a semiconductor device of Embodiment 1. A ring-shaped portion 18A has a single-ring configuration that is the most basic type. The ring-shaped portion 18A has two gaps 19, whereby the ring-shaped portion 18A is divided into two ring-constituting sections 18a and 18b. Internal terminals 20 disposed within the ring-shaped portion 18A are connected to the ring-constituting sections 18a and 18b, respectively, via internal wirings 21. On the outside of each of the ring-constituting sections 18a and 18b, an external wiring 22 is connected linearly.

EMBODIMENT 2

Figure 4:
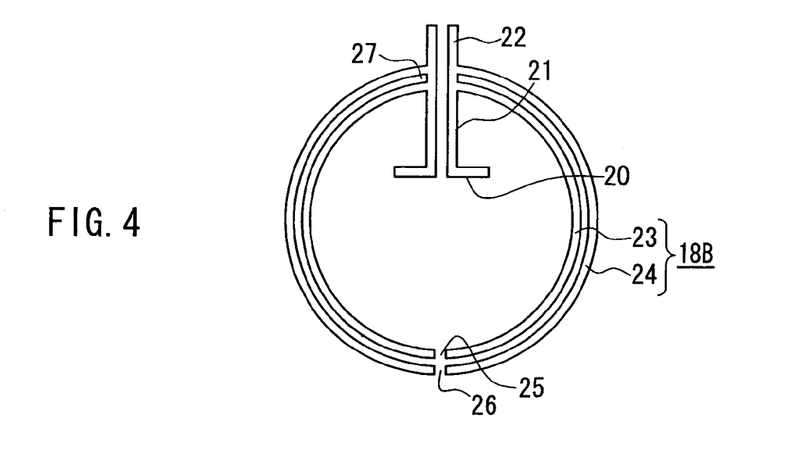
FIG. 4 is a plan view showing a shape of a main portion of a wiring of Embodiment 2.

FIG. 4 is a plan view showing a shape of a main portion of a wiring constituting a semiconductor device of Embodiment 2. In this embodiment, a ring-shaped portion 18B includes an inner ring portion 23 and an outer ring portion 24 so as to form the wiring doubly. In the inner ring portion 23 and the outer ring portion 24, gaps 25 and 26 are formed, respectively, in a similar manner to Embodiment 1. The corresponding ring-constituting sections of the inner ring portion 23 and the outer ring portion 24 are connected via connecting portions 27 so as to form integrated wirings. Internal wirings 21 and external wiring 22 are formed linearly and continuously from the inside to the outside of the ring-shaped portion 18B by way of the connecting portions 27.

The thus configured double ring-shaped portion 18B can increase the effect of preventing the encapsulation resin from overflowing. In addition, by observing a state of the encapsulation resin overflowing into a space between the inner ring portion 23 and the outer ring portion 24, an amount of the spreading encapsulation resin can be determined, thus facilitating the adjustment of the amount to be filled. Furthermore, a dam effect can be obtained from a region between the inner ring portion 23 and the outer ring portion 24, thus facilitating a constant thickness of the resin applied. In order to enhance this function, it is effective to give the inner ring portion 23 a moderate tendency to break. The tendency to break can be adjusted by the number and a length of the gaps.

EMBODIMENT 3

Figure 5A:
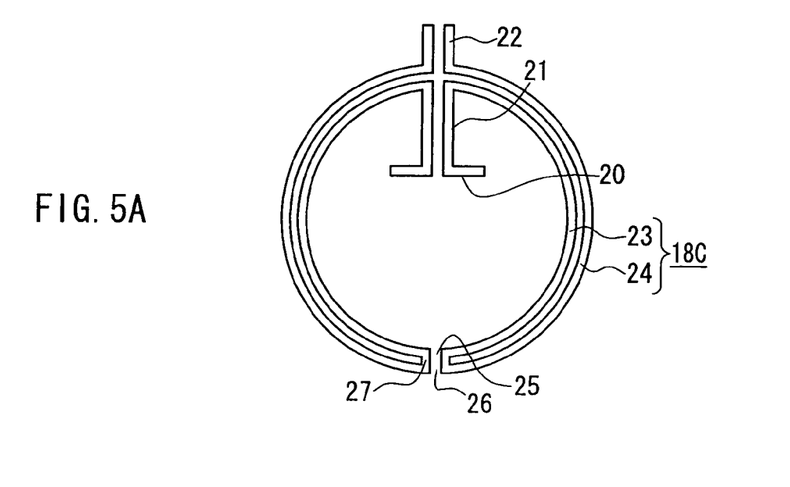
FIGS. 5A to 5C are plan views each showing a shape of a main portion of a wiring of Embodiment 3.

FIG. 5A is a plan view showing a shape of a main portion of a wiring constituting a semiconductor device of Embodiment 3. In a ring-shaped portion 18C according to this embodiment, a connecting point of an internal wiring 21 with an inner ring portion 23 and a connecting point of an external wiring 22 with an outer ring portion 24 are disposed at positions different from each other. In other words, unlike the configuration of FIG. 4, the internal wiring 21 and the external wiring 22 are not continuous linearly. The inner ring portion 23 and the outer ring portion 24 are connected via connecting portions 27 on a side of gaps 25 and 26 that is different from a side of connecting points of the internal wiring 21 and the external wiring 22.

In the case of the geometry where the internal wiring 21 and the external wiring 22 are continuous in a direction of the normal to the ring-shaped portion 18B as shown in FIG. 4, the encapsulation resin is likely to flow while moving along from the internal wiring 21 to the external wiring 22. However, the geometry of this embodiment suppresses the action of the encapsulation resin to move along from the internal wiring 21 to the external wiring 22, whereby an effect by the ring-shaped portion 18C to prevent the encapsulation resin from overflowing can be secured sufficiently.

Figure 5B:
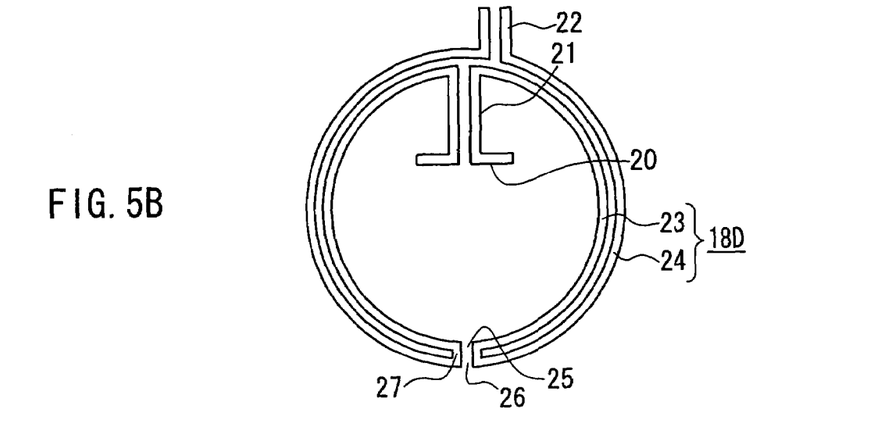
Figure 5C:
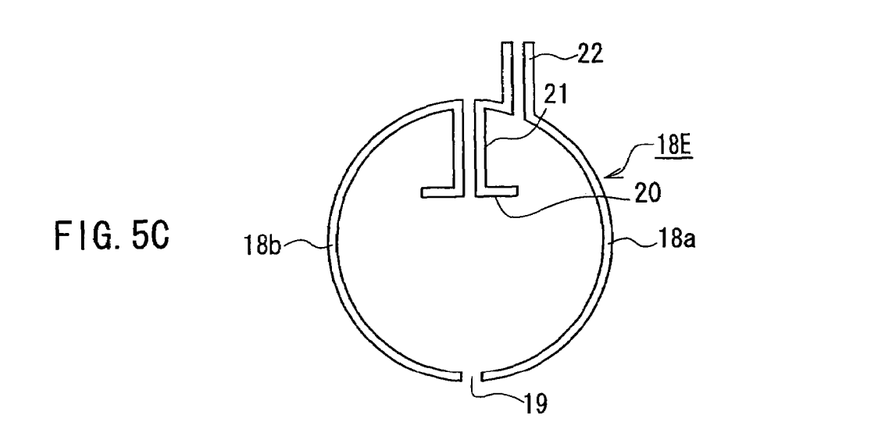

As shown in FIG. 5B, in a ring-shaped portion 18D, the connecting point of the internal wiring 21 with the inner ring portion 23 may be displaced from the connecting point of the external wiring 22 with the outer ring portion 24 in a circumferential direction. This configuration is more effective for suppressing the flow of the encapsulation resin. FIG. 5C shows an example where the wiring configuration of this embodiment is applied to a ring-shaped portion 18E of a single-ring configuration.

EMBODIMENT 4

Figure 6A:
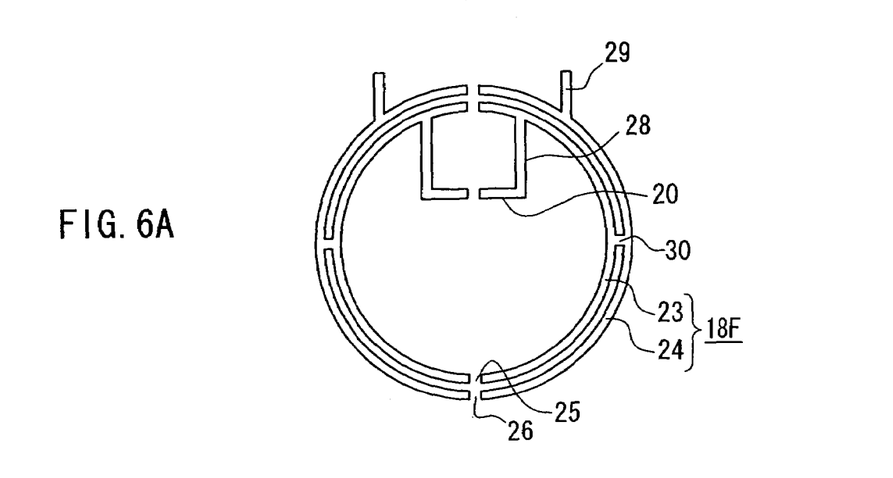
FIGS. 6A and 6B are plan views each showing a shape of a main portion of a wiring of Embodiment 4.

FIG. 6A is a plan view showing a shape of a main portion of a wiring constituting a semiconductor device of Embodiment 4. In a ring-shaped portion 18F of this embodiment, an intersecting portion of an inner ring portion 23 with an internal wiring 28 or an intersecting portion of an outer ring portion 24 with an external wiring 29 is shaped like a letter T. In addition, unlike the above-stated embodiments, connecting portions 30 that connect the inner ring portion 23 and the outer ring portion 24 are disposed at center portion of ring-constituting sections and not at portions of gaps 25 and 26.

Figure 6B:
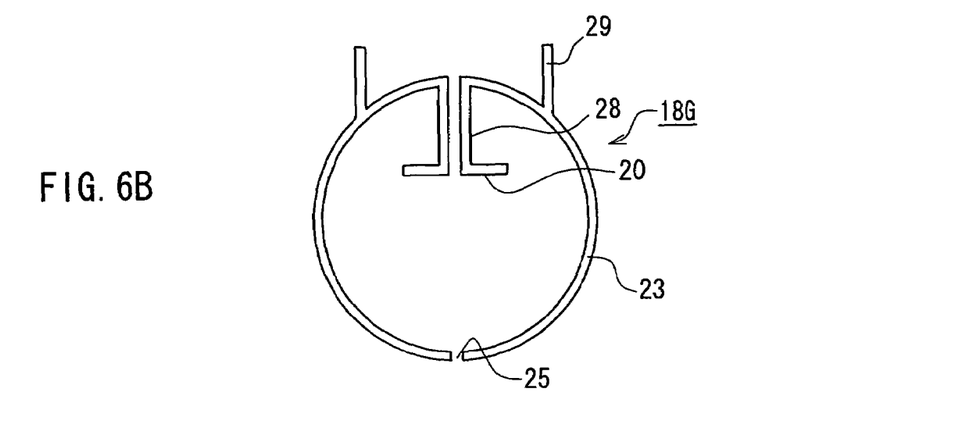

In the case where the intersecting portion of the inner ring portion 23 with the internal wiring 28 is shaped like a letter T as in this embodiment, the action of the encapsulation resin to flow while moving along the wiring can be suppressed as compared with the case where the intersecting portion is shaped like a letter L as in FIG. 5A. Therefore, this configuration facilitates the ring-shaped portion 18F securing the sufficient effect to prevent the encapsulation resin from overflowing. FIG. 6B shows an example where the wiring configuration of this embodiment is applied to a ring-shaped portion 18G of a single-ring configuration.

EMBODIMENT 5

Figure 7:
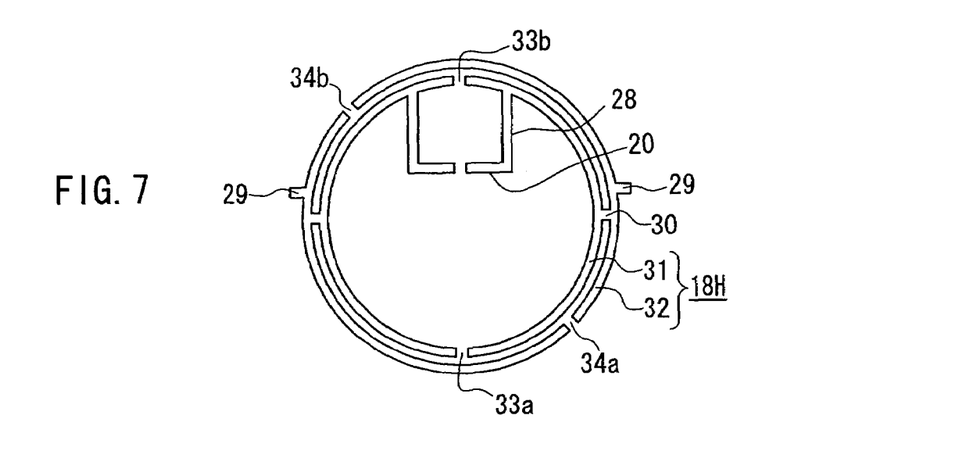
FIG. 7 is a plan view showing a shape of a main portion of a wiring of Embodiment 5.

FIG. 7 is a plan view showing a shape of a main portion of a wiring constituting a semiconductor device of Embodiment 5. In a ring-shaped portion 18H of this embodiment, a plurality of gaps 33a and 33b and gaps 34a and 34b that are formed in an inner ring portion 31 and an outer ring portion 32, respectively, are arranged so as not to be on the same normal line with respect to a ring-shaped portion 18H. In other words, when viewed from a direction of the normal to the ring-shaped portion 18H, the gaps 33a and 33b and the gaps 34a and 34b are arranged so as not to overlap each other.

This configuration can make it difficult for the encapsulation resin to flow through the gaps, thus enhancing the effect of preventing the flow of the encapsulation resin.

EMBODIMENT 6

Figure 8A:
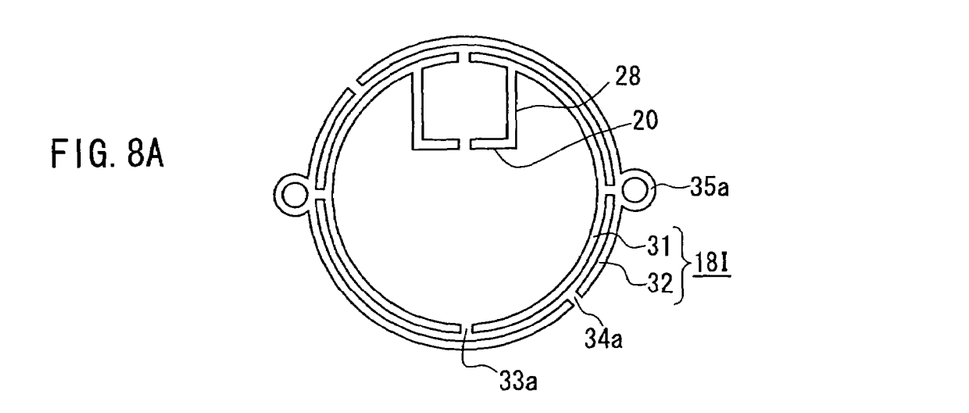
FIGS. 8A and 8B are plan views each showing a shape of a main portion of a wiring of Embodiment 6.

FIG. 8A is a plan view showing a shape of a main portion of a wiring constituting a semiconductor device of Embodiment 6. In a ring-shaped portion 18I of this embodiment, a through hole is formed in a board, and a part of an external wiring is formed as a small ring portion 35a that is arranged so as to correspond to the through hole. The small ring portion 35a is connected to the external wiring (not illustrated) on a rear face of the board via the through hole. The small ring portion 35a is disposed adjacent to an outer edge of an outer ring portion 32. In this way, a connecting portion the outer ring portion 32 and the external wiring is formed in a ring shape, thereby suppressing the flow of an encapsulation resin along the external wiring. That is to say, as a result of the small ring portion 35a being disposed, the wiring has a shape of branching toward the outside when viewed from the outer ring portion 32, and therefore the flow of the resin can be reduced as compared with the case of a simple straight line form.

Figures 8B, 9A:
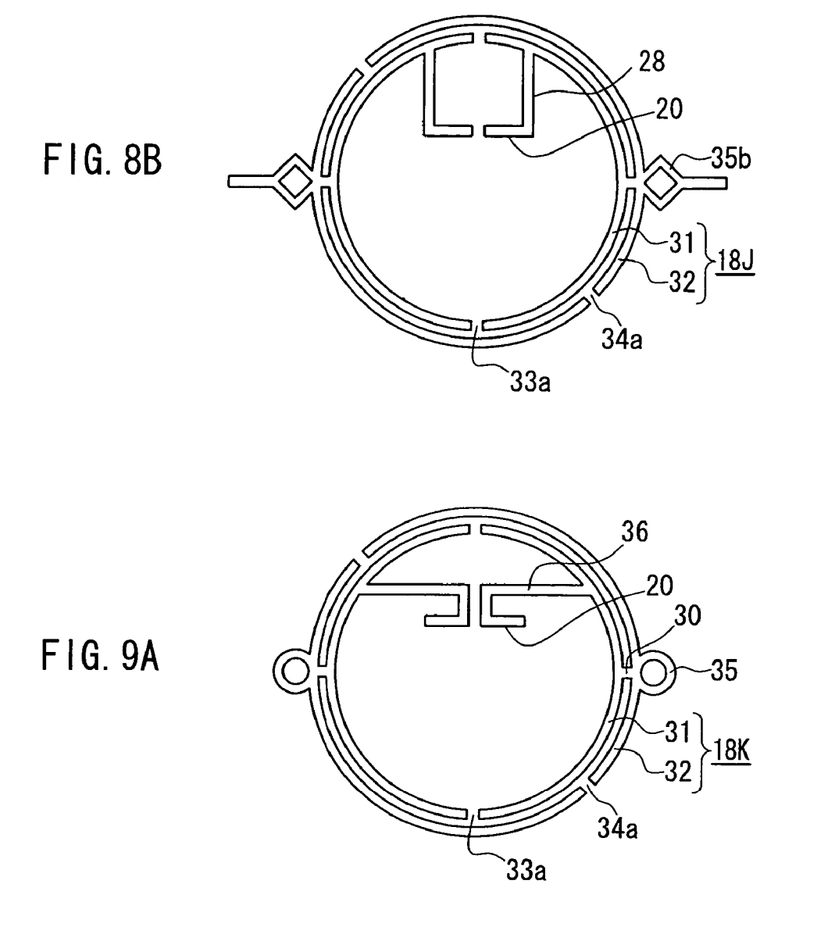
FIGS. 9A to 9D are plan views each showing a shape of a main portion of a wiring of Embodiment 7.

As shown in FIG. 8B, also in the case of a ring-shaped portion 18J with a rectangular small ring portion 35b being provided instead of the circular small ring portion 35 of FIG. 8A, similar effects can be obtained.

EMBODIMENT 7

FIG. 9A is a plan view showing a shape of a main portion of a wiring constituting a semiconductor device of Embodiment 7. In a ring-shaped portion 18K of this embodiment, an internal wiring 36 is formed so as to traverse an inner portion of a ring-shaped portion 18K and divide an inner region of the ring-shaped portion 18K into a region including an internal terminal 20 and a region not including the internal terminal 20. The region not including the internal terminal 20 has a function as a resin reservoir for adjusting an amount of a resin applied.

In this configuration, when the region including the internal terminal 20 is filled with an encapsulation resin, a surplus resin overflows into the region not including the internal terminal 20, so that the amount of the resin applied can be adjusted to be constant in the region including the internal terminal 20. Therefore, as compared with the case of filling a single region with the resin, it becomes easier to secure a constant application amount of the resin at least for the region including the internal terminal 20 by giving a priority to that region.

Figure 9B:
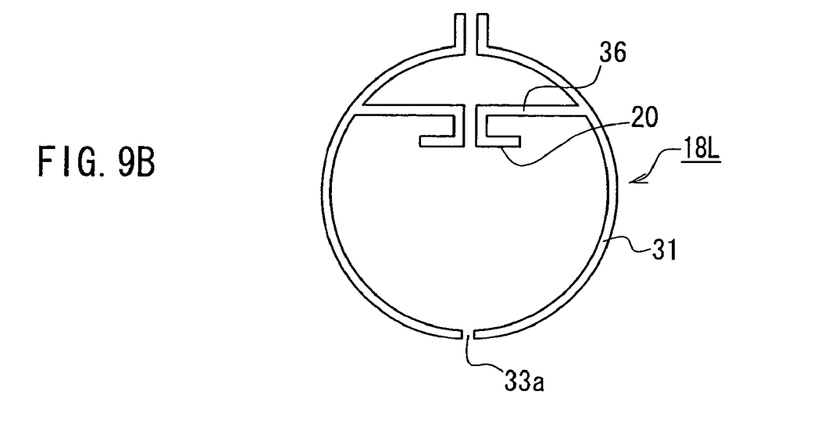
Figure 9C:
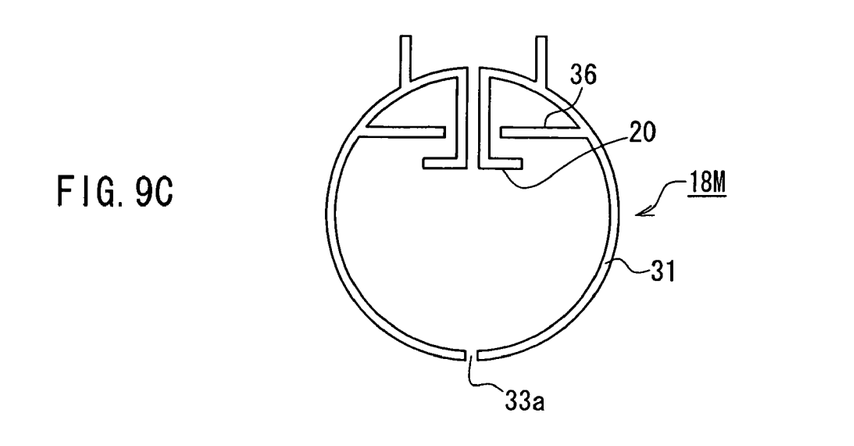
Figure 9D:
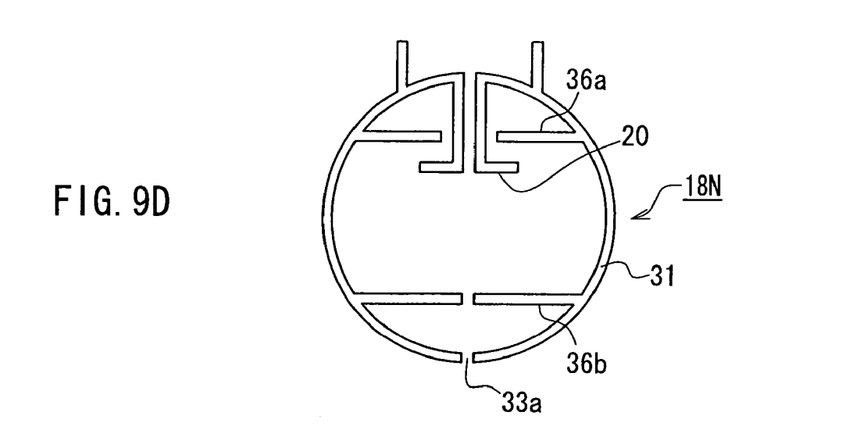

FIGS. 9B through 9D show examples of the wirings to which the idea of the present embodiment is applied. All of these drawings show the case of ring-shaped portions 18L to 18N having a single-ring configuration. In the example of FIG. 9D, two pairs of internal wirings 36a and 36b are formed so as to provide resin reservoirs at two positions in the ring-shaped portion 18N for adjusting an amount of a resin applied.

The portion to which the encapsulation resin is to be applied by priority is not limited to the portion including the internal terminal 20, and the present embodiment can be applied to the case of the other regions in which a specific object such as a semiconductor chip is arranged as well. In addition to such a purpose, the configuration of the present embodiment may be applied for the sake of forming a trap, which copes with the case of an amount of the encapsulation resin filled being too much.

EMBODIMENT 8

Figure 10:
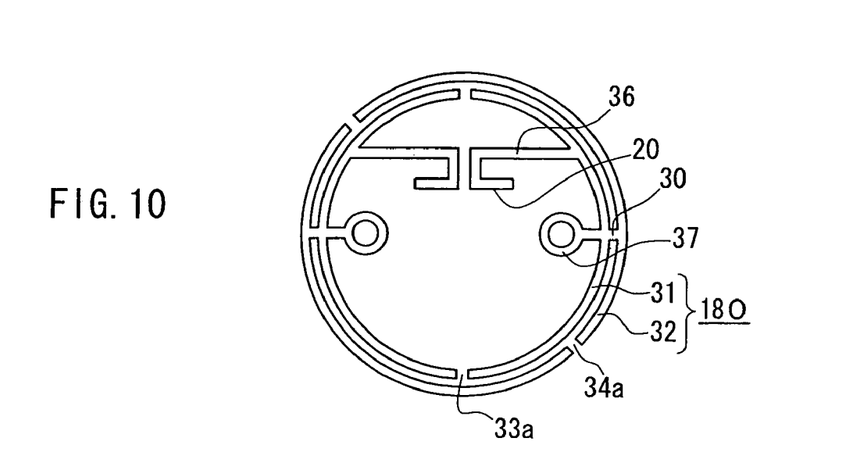
FIG. 10 is a plan view showing a shape of a main portion of a wiring of Embodiment 8.

FIG. 10 is a plan view showing a shape of a main portion of a wiring constituting a semiconductor device of Embodiment 8. In a ring-shaped portion 18O of this embodiment, a through hole is formed in a board within an inner region, and a part of an internal wiring is formed as a small ring portion 37 that corresponds to the through hole. The small ring portion 37 is connected to the external wiring (not illustrated) on a rear face of the board via the through hole. Unlike Embodiment 6, the small ring portion 37 is disposed within an inner ring portion 31.

With this configuration, the wiring is not lead out to the outside of the ring-shaped portion 18O, and therefore it suppresses the flow of the encapsulation resin to the outside of the ring-shaped portion 18O. However, there is a limitation on the number of the through holes that can be formed within the ring-shaped portion 18O.

EMBODIMENT 9

Figure 11A:
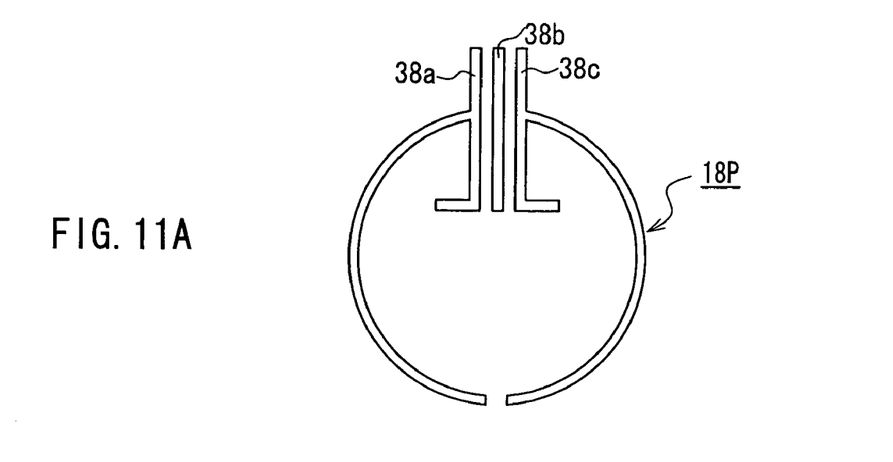
FIG. 11A is a plan view for explaining features of the wirings of Embodiment 9.
Figure 11B:
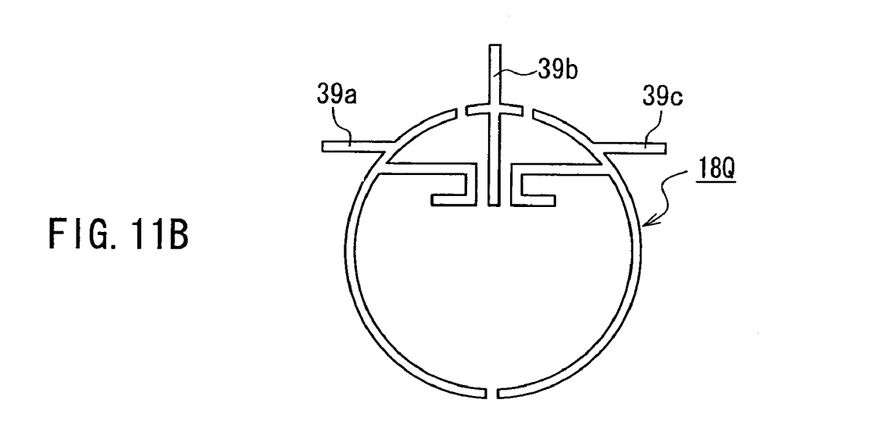
FIGS. 11B and 11C are plan views each showing a shape of a main portion of a wiring of Embodiment 9.
Figure 11C:
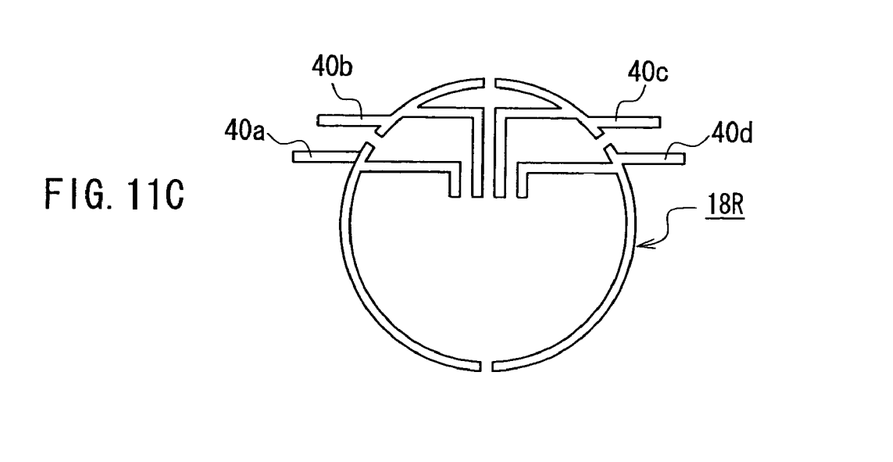

Referring now to FIGS. 1A to C, Embodiment 9 will be explained below. The above-stated embodiments deal with the case of two wirings being provided as examples, for the simplification of the explanations. However, the present invention can be applied to the cases of three or more wirings being provided. However, in the case of three or more wirings, the configuration of the wirings should be devised so as to prevent a resin from overflowing from the ring-shaped portion.

For example, in the case of the configuration shown in FIG. 11A, the resin is likely to overflow. These wirings have a configuration where one linear wiring is added to the wiring configuration shown in FIG. 3. As a result, three linear wirings 38a, 38b and 38c, in each of which an internal wiring and an external wiring are continuously formed, are arranged so as to traverse a line of a ring-shaped portion 18P. In the case of such a configuration, it is difficult to make the total of the widths of the three linear wirings 38a, 38b and 38c less than 0.5 mm in view of the dimensions of ordinary wirings. In addition, when an encapsulation resin having normal properties is used, if three such linear wirings are present from the inside to the outside of the ring-shaped portion 18P, the resin being filled is extremely likely to overflow from the ring-shaped portion 18P to the outside. Therefore, in the case of forming three or more wirings, it is desirable that the configuration of the wirings is set so that two or less line segments are arranged linearly and in parallel from the outside to the inside of the ring-shaped portion at an intersecting portion of each of the wirings with the ring-shaped portion.

FIG. 11B and FIG. 11C show the examples of the wiring configuration for avoiding this problem. FIG. 11B shows the example where three wirings 39a, 39b and 39c are formed, and FIG. 11C show the example where four wirings 40a, 40b, 40c and 40d are formed. These configurations can avoid the arrangement of three or more wirings linearly and in parallel from the outside to the inside of the ring-shaped portions 18Q and 18R. Thereby, the flow of the resin can be controlled favorably without excessive constraints on the dimensions of the respective wirings.

In the above embodiments, it is desirable that an angle at the intersection between the external wiring and the wiring of the ring-shaped portion is 60° or more (in terms of the configuration, the upper limit becomes 90°). This is because, when the wiring intersects with the ring-shaped wiring from the outside in a slanting relation, the resin becomes likely to overflow along the slanting portion.

The ideas of the present invention described with reference to the above embodiments can be applied also to the formation of a bank using an element other than the wiring so as to control the flow. That is to say, the configuration of the ring-shaped portion and the mechanism for controlling the flow of the resin according to the present invention can be applied also to the case where a resin ring, for example, is arranged instead of the wiring.

In the above embodiments, the respective wirings are configured as a continuous shape. However, in the case where a surface of copper foil is subjected to electroless plating, for example, a configuration in which isolated wirings are present also is acceptable. However, the case of electro-plating requires a plating bar, and therefore there is a need to form the respective wirings in a continuous configuration. Therefore, in the case of the configuration having a multi-ring portion, it is effective to adopt the configurations as stated in the above embodiments in order to form the continuous configuration that does not include discontinuous portions in each of the wirings.

The present invention is not limited to a COB type device, and can be applied to various electronic components and semiconductor packages. For instance, the present invention can be applied even in the case of flip-chip packaging, so as to control the flow of an under fill and an encapsulation resin.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. An electronic circuit device, comprising:
    a board on which internal terminals and wirings connected to the internal terminals are formed;
    an electronic component that is mounted on the board and is connected with the internal terminals; and
    an encapsulation resin with which the electronic component and the internal terminals are encapsulated,
    wherein a part of the wiring forms a ring-shaped portion, the ring-shaped portion having a plurality of gaps by which the ring-shaped portion is divided into a plurality of discontinuous ring-constituting sections, the wiring is connected with a wiring on a rear face of the board via a through hole formed in the board, the through hole being disposed adjacent to an outer edge of the ring-shaped portion, and
    wherein the plurality of ring-constituting sections are connected to the respective internal terminals, and the encapsulation resin is in contact with an inner side of the ring-shaped portion.

2. The electronic circuit device according to claim 1, wherein the ring-shaped portions of the wirings are formed as a multi-ring.

3. The electronic circuit device according to claim 1,
    wherein the internal terminals are disposed within the ring-shaped portion,
    the wirings extend from an outside of the ring-shaped portion to the respective internal terminals so as to be connected thereto via the ring-shaped portion, and
    a connecting point of the wiring extending from the internal terminal with the ring-shaped portion and a connecting point of the wiring extending from the outside with the ring-shaped portion are disposed at positions different from each other.

4. The electronic circuit device according to claim 1, wherein an intersecting portion of the ring-shaped portion and one end of the wiring is shaped like a letter T.

5. The electronic circuit device according to of claim 1, wherein a part of the wiring is formed so as to divide an inner region of the ring-shaped portion into a region including the internal terminals and a region not including the internal terminals.

6. The electronic circuit device according to claim 1, wherein, three or more wirings are formed, and at an intersecting portion of the wirings and the ring-shaped portion, two or less line segments are disposed linearly and in parallel from an outside to an inside of the ring-shaped portion.

7. The electronic circuit device according to claim 1, wherein the wiring extending on the outside of the ring-shaped portion and the ring-shaped portion of the wiring intersect each other at angles of 60° or more.

8. The electronic circuit device according to claim 2, wherein the gaps provided in the respective wirings of the multi-ring as the ring-shaped portion are disposed so as not to be on a same normal line with respect to the ring-shaped portion.

9. An electronic circuit device, comprising:
    a board on which internal terminals and wirings connected to the internal terminals are formed;
    an electronic component tat is mounted on the board and is connected with the internal terminals; and
    an encapsulation resin with which the electronic component and the internal terminals are encapsulated,
    wherein a part of the wiring forms a ring-shaped portion, the ring-shaped portion having a plurality of gaps by which the ring-shaped portion is divided into a plurality of discontinuous ring-constituting sections, the wiring is connected with a wiring on a rear face of the board via a through hole formed in the board, the through hole being disposed within the ring-shaped portion, and
    wherein the plurality of ring-constituting sections are connected to the respective internal terminals, and the encapsulation resin is in contact with an inner side of the ring-shaped portion.

10. The electronic circuit device according to claim 9, wherein the ring-shaped portions of the wirings are formed as a multi-ring.

11. The electronic circuit device according to claim 9,
    wherein the internal terminals are disposed within the ring-shaped portion,
    the wirings extend from an outside of the ring-shaped portion to the respective internal terminals so as to be connected thereto via the ring-shaped portion, and
    a connecting paint of the wiring extending from the internal terminal with the ring-shaped portion and a connecting point of the wiring extending from the outside with the ring-shaped portion are disposed at positions different from each other.

12. The electronic circuit device according to claim 9, wherein an intersecting portion of the ring-shaped portion and one end of the wiring is shaped like a letter T.

13. The electronic circuit device according to of claim 9, wherein a part of the wiring is formed so as to divide an inner region of the ring-shaped portion into a region including the internal terminals and a region not including the internal terminals.

14. The electronic circuit device according to claim 9, wherein three or more wirings are formed, and at an intersecting portion of the wirings and the ring-shaped portion, two or less line segments are disposed linearly and in parallel from an outside to an inside of the ring-shaped portion.

15. The electronic circuit device according to claim 9, wherein the wiring extending on the outside of the ring-shaped portion and the ring-shaped portion of the wiring intersect each other at angles of 60° or more.

16. The electronic circuit device according to claim 10, wherein the gaps provided in the respective wirings of the multi-ring as the ring-shaped portion are disposed so as not to be on a same normal line with respect to the ring-shaped portion.

* * * * *